US006702900B2

United States Patent
Yeh et al.

(10) Patent No.: US 6,702,900 B2
(45) Date of Patent: Mar. 9, 2004

(54) WAFER CHUCK FOR PRODUCING AN INERT GAS BLANKET AND METHOD FOR USING

(75) Inventors: Su-Yu Yeh, Taipei (TW); Huai-Tei Yang, Hsin-Chu (TW); Cheng-Yang Pan, Taipei (TW); Jun-Yang Lai, Ping-Tung (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 171 days.

(21) Appl. No.: 09/815,216

(22) Filed: Mar. 22, 2001

(65) Prior Publication Data

US 2002/0134514 A1 Sep. 26, 2002

(51) Int. Cl.$^7$ .......................... C23C 16/00; C23F 1/00; H01L 21/306
(52) U.S. Cl. .................. 118/730; 156/345.55; 216/58; 427/346; 34/359; 34/58
(58) Field of Search .......... 156/345.23, 345.51–345.55; 118/730; 216/58; 427/346; 34/58, 85, 359

(56) References Cited

U.S. PATENT DOCUMENTS

| 5,312,487 A | * | 5/1994 | Akimoto et al. | ............... 118/52 |
| 5,326,725 A | * | 7/1994 | Shertinsky et al. | .......... 437/225 |
| 5,445,677 A | * | 8/1995 | Kawata et al. | ............... 118/724 |
| 5,551,983 A | * | 9/1996 | Shepard et al. | .......... 118/723 R |
| 5,851,299 A | * | 12/1998 | Cheng et al. | ................ 118/729 |
| 5,888,304 A | * | 3/1999 | Umotoy et al. | ............. 118/720 |
| 6,221,204 B1 | * | 4/2001 | Liu | ........................ 156/345.22 |
| 6,309,981 B1 | * | 10/2001 | Mayer et al. | .................. 437/54 |
| 6,375,748 B1 | * | 4/2002 | Yudovsky et al. | ........... 118/728 |
| 6,435,200 B1 | * | 8/2002 | Langen | ........................ 134/99.1 |

* cited by examiner

Primary Examiner—Parviz Hassanzadeh
Assistant Examiner—Karla Moore
(74) Attorney, Agent, or Firm—Tung & Associates

(57) ABSTRACT

A wafer chuck for use in a semiconductor process chamber capable of producing an inert gas blanket positioned on the chuck from residual chemical vapor in the chamber is disclosed. A plurality of mounting pins for supporting a wafer is further provided in the upper surface for forming an inert gas into a cavity formed between the wafer and the upper surface of the chuck. A plurality of apertures in a sidewall of the body portion for flowing an inert gas into the lower chamber forming an inert gas blanket blocking a passageway between the upper and lower chambers, thus preventing the wafer from damage by residual chemical vapor in the lower chamber.

9 Claims, 2 Drawing Sheets

WAFER CHUCK FOR PRODUCING AN INERT GAS BLANKET AND METHOD FOR USING

FIELD OF THE INVENTION

The present invention generally relates to a wafer chuck used in a semiconductor process chamber and more particularly, relates to a wafer chuck in a semiconductor process chamber that is capable of producing an inert gas blanket for insulating a wafer from harmful chemicals and a method for using the chuck.

BACKGROUND OF THE INVENTION

In the fabrication of semiconductor devices, a silicon wafer must be process by many processing steps, i.e. as many as several hundred, in order to produce a final product of an IC chip. In the various chemical or physical processes for performing the fabrication steps, a silicon wafer must be held onto a wafer carrying device, such as a wafer chuck securely in a process chamber such that an active surface of the wafer can be processed.

One or more of such numerous processing steps may be an etching or cleaning step in which a silicon wafer is etched in a spin etcher. In a typical spin etcher, a wafer is held on a wafer chuck that rotates at a predetermined rotational speed while an acid solution is sprayed on top of the wafer surface. For instance, in recent semiconductor processing technology, cobalt deposition is frequently used in forming transistor gates on the silicon surface. After the completion of a cobalt deposition process, the backside of the wafer must be cleaned due to the extreme mobility of the cobalt atoms during a sputtering process. A suitable cleaning process for removing the cobalt particles on the backside of a silicon wafer is by using the spin etching apparatus.

Many different types of spin etchers have been designed to suit specific etching requirements on a silicon wafer. FIG. 1 illustrates a conventional spin etcher that has four-level etch chambers or etch stations formed in a single etcher.

Referring now to FIG. 1, wherein a conventional multi-leveled spin etcher 10 is shown. Spin etcher 10 is constructed by four different levels of reaction chambers 12, 14, 16 and 18. Each of the reaction chambers are formed by a partitioning member 20 which cooperates with a wafer chuck 22 divides the cavity of the spin etcher in four different sub-cavities 22, 24, 26 and 28. The conventional wafer chuck 22 is provided with an internal passageway 30 for passing an inert gas such as nitrogen into a cavity 32 formed between a wafer 34 and the top surface 36 of the wafer chuck 22. The wafer 34 is supported by a plurality of mounting pins 38 as shown in FIG. 1. The wafer chuck 22 is driven, or rotated, by shaft 40 to a suitable rotational speed during the etching process.

The multi-leveled spin etcher 10 shown in FIG. 1 provides the benefit that a single etcher can be used to execute various etching steps by either using different etchant or the same etchant at different concentrations. During the etching process, an acid, or a diluted acid solution, is sprayed from the top of the chamber (not shown) to etch the backside of the wafer 34, for instance, after a silicon wafer is sputter deposited with cobalt. The shaft 40 elevates or lowers the wafer chuck 22 between the various etch stations 12, 14, 16 and 18. The rotation of the shaft 40 and the rotation of the wafer 34 situated on top of the wafer chuck 22 results in a more uniform etch reaction on the surface of the wafer, and thus a more satisfactory etch reaction.

In most spin etching reactions, a highly corrosive acid in a diluted form is sprayed into the chamber cavity 22, 24, 26 or 28. While each of the chamber sub-cavities 22~28 is equipped with an exhaust conduit 42 to evacuate the sub-cavities after an etch reaction has been conducted, such withdrawal is not always effective such that residual acid vapor stays in the sub-cavities. In the multi-leveled spin etcher 10, the upward/downward movement of the wafer chuck 22 further contributes to the migration of acid vapor from one sub-cavity into the sub-cavity above it. The acidic vapor therefore corrodes the backside of the wafer 34 by flowing into the cavity 32 formed between the wafer and the wafer chuck 22. In the case of a backside cleaning after a cobalt deposition on a silicon wafer, the backside of the wafer 34, i.e. the side that faces downwardly, is actually the active side of the wafer and thus, any corrosive effect on the active side of the wafer can produce detrimental effects. When the active surface of the wafer 34 is attacked by acid vapor, serious quality and reliability problems occur which greatly effects the throughput of the spin etching process.

It is therefore an object of the present invention to provide a wafer chuck in a semiconductor process chamber that can be used without the drawbacks or shortcomings of the conventional wafer chuck.

It is another object of the present invention to provide a wafer chuck for use in a semiconductor process chamber capable of producing an inert gas blanket shielding a wafer positioned thereon.

It is a further object of the present invention to provide a wafer chuck for use in a semiconductor process chamber that is equipped with inert gas passageways in the chuck for flowing an inert gas into an upper portion of the reaction chamber and forming an inert gas blanket.

It is another further object of the present invention to provide a wafer chuck for use in a semiconductor process chamber that is provided with a plurality of apertures in a sidewall of the wafer chuck for flowing an inert gas into the reaction chamber and thus insulate a wafer positioned on the chuck.

It is still another object of the present invention to provide a process chamber for processing semiconductor wafers that includes a wafer chuck capable of producing an inert gas blanket around a wafer positioned on the chuck and preventing the wafer from being damaged by residual chemical vapor in the chamber.

It is yet another object of the present invention to provide a process chamber for processing semiconductor wafers which is equipped with a multi-leveled sub-chamber for etching a semiconductor wafer and protecting the wafer from being damaged by residual chemical vapor in the process chamber.

It is still another further object of the present invention to provide a method for chemical treating a wafer topside without damaging the wafer backside by residual chemical vapor in a process chamber.

It is yet another further object of the present invention to provide a method for chemical treating a wafer topside without damaging the wafer backside by residual chemical vapor in a process chamber by providing a wafer chuck equipped with internal passageways for feeding an inert gas into the chamber cavity and thus blocking the wafer from the residual chemical vapor.

SUMMARY OF THE INVENTION

In accordance with the present invention, a wafer chuck for producing an inert gas blanket to insulate a wafer positioned on the chuck and a method for chemical treating a wafer topside without damaging the wafer backside by residual chemical vapor in the chamber are provided.

In a preferred embodiment, a method for chemical treating a wafer topside without damaging the wafer backside by residual chemical vapor in a process chamber can be carried out by the operating steps of first providing a wafer chuck for mounting a wafer thereon; positioning the wafer chuck in the process chamber wherein an upper surface of the chuck substantially separates an upper chamber and a lower chamber; and rotating the chuck and conducting a chemical process on the topside of the wafer while simultaneously flowing an inert gas through a sidewall of the wafer chuck into an upper portion of the lower chamber stopping chemical vapor from flowing from the lower chamber into the upper chamber and preventing the backside of the wafer from being attacked by the chemical vapor.

The method for chemical treating a wafer topside without damaging the wafer backside by residual chemical vapor in the process chamber may further include the steps of stopping a flow of the chemical into the upper chamber and withdrawing residual chemical from the upper chamber while the inert gas being flown into the lower chamber. The method may further include the step of mounting a wafer chuck in a process chamber that is a spin etcher, or the step of providing the process chamber in a multi-level spin etcher. The method may further include the step of rotating the wafer chuck to a rotational speed between about 500 RPM and about 1200 RPM, or the step of flowing an inert gas of $N_2$ into the upper portion of the lower chamber. The method may further include the step of mounting a wafer onto a plurality of mounting pins in the upper surface of the wafer chuck such that the wafer is suspended over and spaced-apart from the upper surface, or the step of purging an inert gas onto the wafer backside during the rotation of the chuck and the chemical process is conducted on the wafer topside. The method may further include the step of moving the chuck upwardly or downwardly to each of a plurality of sub-chambers in the multi-level spin etcher, or the step of providing inert gas nozzles through the sidewall of the wafer chuck.

The present invention is further directed to a wafer chuck for producing an inert gas blanket to insulate a wafer positioned thereon in a process chamber which includes a body portion in an inversed cylindrical shape that has an upper surface larger than a lower surface, the upper surface has a size capable of dividing a cavity of the process chamber into an upper chamber and a lower chamber; a plurality of mounting pins in the upper surface of the body portion adapted for supporting a wafer thereon suspended from the upper surface; a plurality of apertures in the upper surface for flowing an inert gas into a cavity formed between the wafer and the upper surface; a shaft portion attached to the body portion for providing a rotational motion to the body portion; and a plurality of apertures in a sidewall of the body portion for flowing an inert gas into the lower chamber forming an inert gas blanket blocking a passageway between the upper and the lower chambers.

In the wafer chuck for producing an inert gas blanket to insulate a wafer positioned thereon in a process chamber, the process chamber may be a spin etcher or a multi-level spin etcher. The wafer chuck may further include a partition means mounted on a chamber wall cooperating with the upper surface of the chuck body to substantially divide an upper chamber from a lower chamber. The wafer chuck may further include means for rotating the shaft portion to a rotational speed between about 500 RPM and about 1200 RPM.

The present invention is still further directed to a process chamber for processing semiconductor wafers that includes a wafer chuck formed of a body portion and a shaft portion, the body portion has an upper surface of sufficient size to divide a cavity in the chamber into an upper cavity and a lower cavity, the upper surface of the body portion has a plurality of apertures for purging an inert gas onto a backside of a wafer positioned thereon; a plurality of apertures in a sidewall of the body portion of the wafer chuck for flowing an inert gas into an upper portion of the lower cavity forming an inert gas blanket insulating the wafer; a partition means mounted to a chamber wall of the chamber cooperating with the upper surface of the body portion to form the upper and lower cavities; and a motor means for rotating the shaft portion to a rotational speed between about 500 RPM and about 1200 RPM.

The process chamber for processing semiconductor wafers may further include conduit means in the body portion of the wafer chuck for transporting an inert gas to the plurality of apertures in the upper surface and in the sidewall of the body portion. The process chamber may be a multi-level spin etcher. The inert gas flown through the plurality of apertures may be nitrogen or argon. The process chamber may further include a plurality of mounting pins in the upper surface of the body portion for supporting a wafer thereon and for suspending the wafer from the upper surface.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

Figure 1:
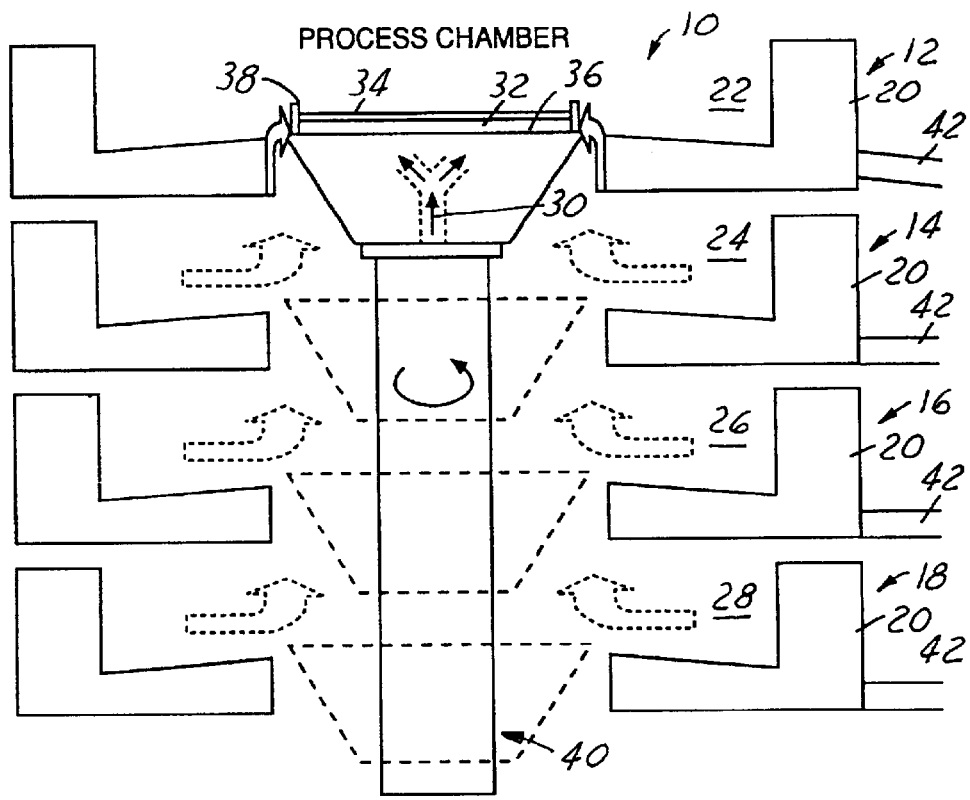
FIG. 1 is a cross-sectional view of a conventional multi-level process chamber with a wafer chuck positioned therein.

The present invention discloses a wafer chuck for producing an inert gas blanket to insulate a wafer positioned on the chuck and in a process chamber. The wafer chuck is constructed by a body portion, a plurality of mounting pins in the body portion, a plurality of apertures in a top surface of the body portion, a shaft portion, and a plurality of apertures in the sidewall of the body portion of the wafer chuck. The body portion is provided with an upper surface that has a size sufficiently large so as to divide a cavity of the process chamber into an upper chamber and a lower chamber. The plurality of mounting pins is provided in a top surface of the body portion for supporting a wafer thereon suspended from the top surface. The shaft portion provides a rotational motion to the body portion. The plurality of apertures in the sidewall flows an inert gas into the lower chamber forming an inert gas blanket blocking a passageway between the upper and the lower chambers.

The present invention further discloses a process chamber for processing semiconductor wafers that includes a wafer chuck, a plurality of apertures in the chuck, a partition means and a motor means. The wafer chuck is formed of a body portion and a shaft portion wherein the body portion has an upper surface of sufficiently large size to divide a cavity in the chamber into an upper cavity and a lower cavity. The upper cavity of the body portion has a plurality of apertures for purging an inert gas onto a backside of a wafer positioned on the chuck. The body portion further has a plurality of apertures in a sidewall of the chuck for flowing an inert gas into an upper portion of the lower cavity to form an inert gas blanket insulating the wafer. The chamber further includes a partition means that is mounted to the chamber wall for cooperating with the upper surface of the body portion to form the upper and lower cavities. The motor means is used to rotate the shaft portion to a rotational speed between about 500 RPM and about 1200 RPM.

The present invention further discloses a method for chemically treating a wafer topside without damaging the wafer backside by residual chemical vapor in a process chamber which can be executed by the steps of first providing a wafer chuck for mounting a wafer thereon; then positioning the wafer chuck in the process chamber wherein an upper surface of the chuck substantially separates an upper chamber and a lower chamber; and rotating the chuck and conducting a chemical process on the topside of the wafer while simultaneously flowing an inert gas through a sidewall of the wafer chuck into an upper portion of the lower chamber to stop chemical vapor from flowing from the lower chamber into the upper chamber and thus preventing the backside of the wafer from being attacked by the chemical vapor.

In the preferred embodiment of the invention, a process machine of a spin etcher made by SEZ Corporation, Model 203, is used for demonstrating the invention. However, it should be understood that the present invention novel method and device can be equally applicable to any other process machine that may have residual chemical vapor in the chamber cavities that are separated by a wafer chuck. As shown in the preferred embodiment, when the spin etcher is used for a wafer backside contamination cleaning, during which the wafer chuck is moved up and down to different processing stations in the process chamber, such that different acid processes can be carried out. After a prolonged process time, residual acid vapor which exists in the open-system chamber may diffuse to an upper chamber to damage the wafer surface during a wafer drying cycle. The present invention novel chuck design which incorporates inert gas nozzles in the sidewall of the chuck. By utilizing the present invention wafer chuck, when a wafer is moved up to the upper level of the process chamber while being rotated, an inert gas flow of $N_2$ forms a curtain, i.e. a blanket, on the top of the lower chamber to prevent residual acid vapor from back diffusion into the upper chamber.

Figure 2:
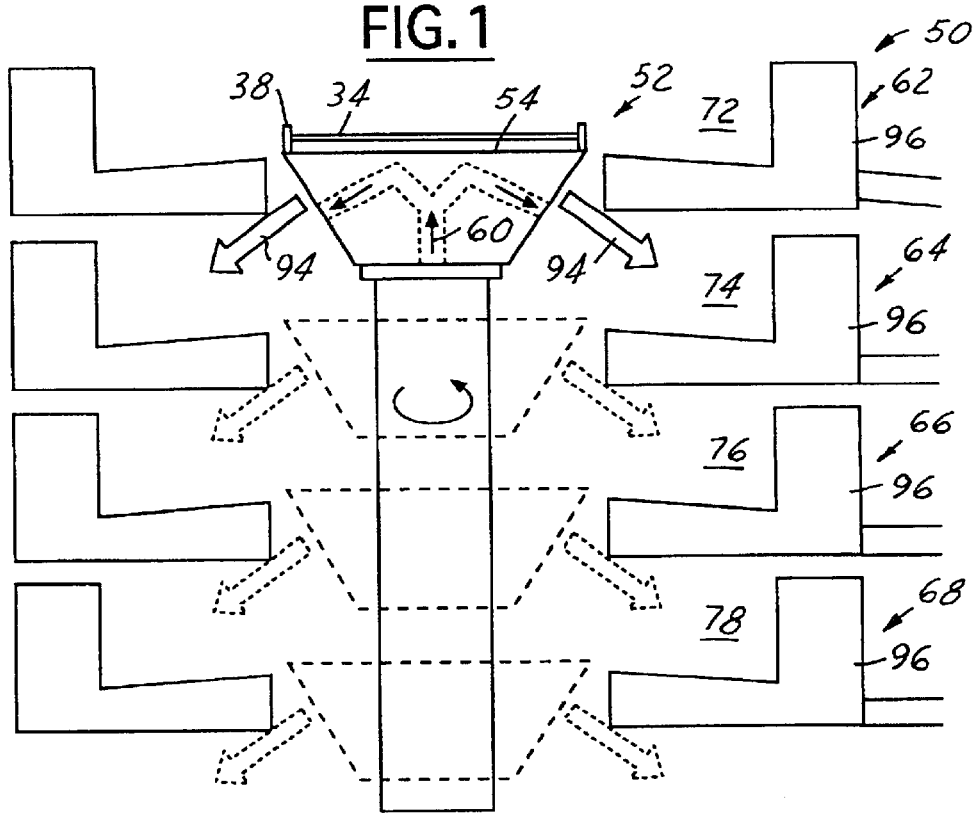
FIG. 2 is a cross-sectional view of the present invention multi-level process chamber equipped with a wafer chuck capable of forming an inert gas blanket for shielding the wafer positioned on the chuck.

Referring now to FIG. 2, wherein an enlarged, cross-sectional view of a process chamber 50 equipped with a present invention wafer chuck 52 is shown. On a top surface 54 of the wafer chuck 52, is provided with a plurality of mounting pins 38 for supporting a wafer 34 thereon. The process chamber 50 is constructed by a series of multi-level sub-chambers of 62, 64, 66 and 68 each having a chamber cavity 72, 74, 76 and 78, respectively.

Figure 3:
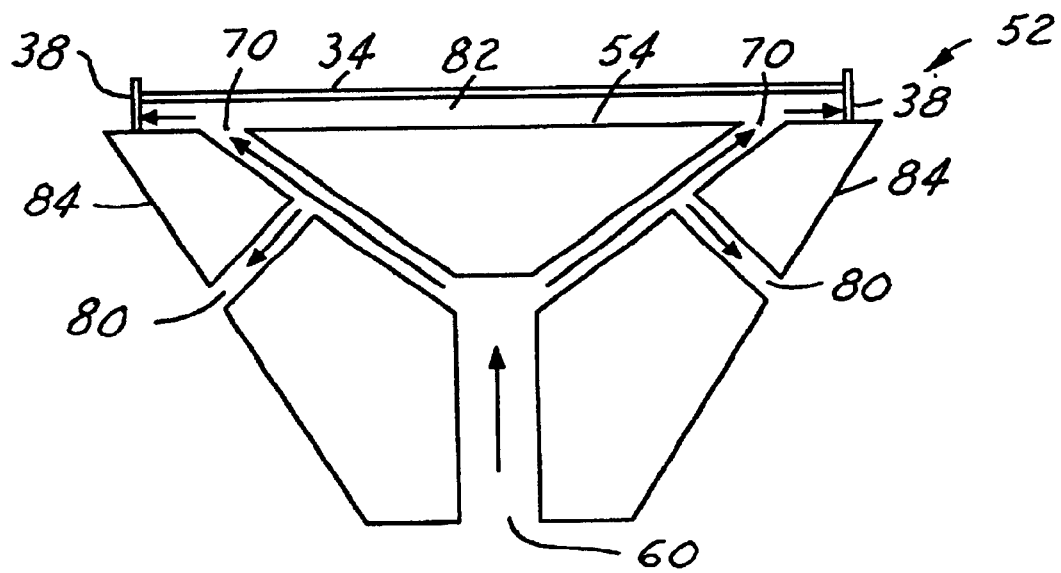
FIG. 3 is an enlarged, cross-sectional view of a preferred embodiment of the present invention wafer chuck.
Figure 4:
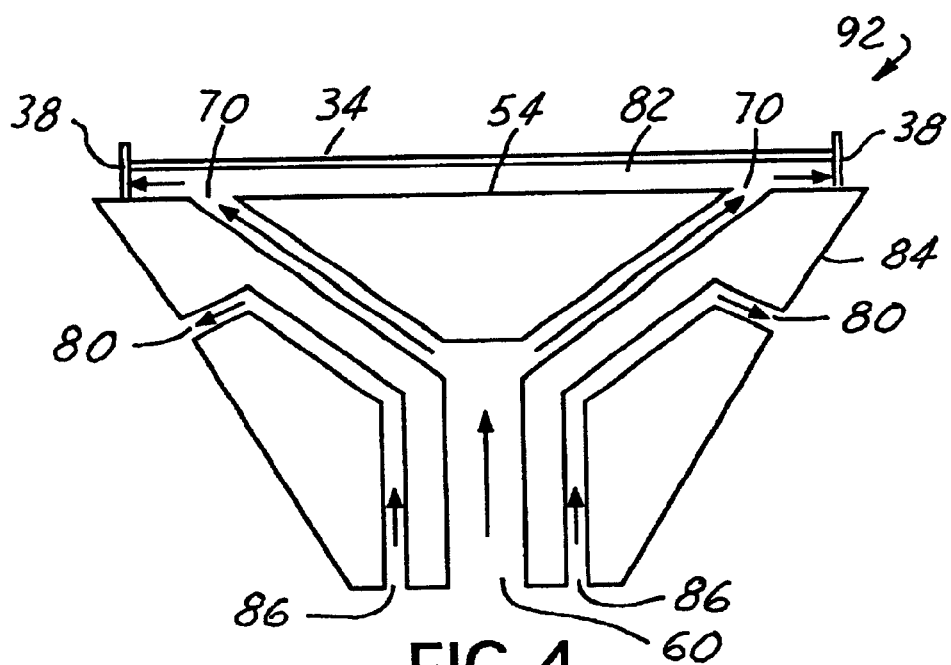
FIG. 4 is an enlarged, cross-sectional view of an alternate embodiment of the present invention wafer chuck.

An enlarged, cross-sectional view of the present invention wafer chuck 52 is shown in FIG. 3. An internal inert gas passageway 60 is provided for flowing an inert gas through the wafer chuck 52 exiting a plurality of apertures 70 provided in the upper surface 54 of the chuck. In addition to the plurality of apertures 70 for supplying an inert gas into the cavity 82 formed between the wafer 34 and the upper surface 54 of the chuck, a plurality of cavities 80 are further provided in the sidewall 84 of the wafer chuck 52. It should be noted that the plurality of apertures 80 is branched off the main gas passageway 60 in this preferred embodiment. The plurality of apertures 80 may further be supplied by independent gas passageways 86, as shown in FIG. 4, in an alternate embodiment. In this alternate embodiment, a more independent control of the inert gas flow into the cavity 74 (see FIG. 2) can be achieved. The wafer chuck 92, shown in the alternate embodiment, can be constructed similar to that in the preferred embodiment, except the gas passageway 86 for providing a flow of inert gas in forming the inert gas blanket.

In either the preferred or alternate embodiments, it is noted that the apertures 80 are formed in a perpendicular direction to the sidewall 84 of the wafer chuck such that an inert gas flow exits the apertures 80 in a downward direction. This downward direction inert gas flow is also shown in FIG. 2 by the arrows 94. The inert gas flow 94 therefore provides an inert gas blanket, or cloud, to block a small passageway between the wafer chuck 52 and the partition means 96. While a common inert gas used is $N_2$, any other suitable inert gas may also be utilized in the present invention wafer chuck. The wafer chuck 52 can be advantageously fabricated in a plastic material that is chemical and high temperature resistant.

The present invention novel wafer chuck for producing an inert gas blanket to insulate a wafer positioned on the chuck and a method for chemical treating a wafer topside without damaging the wafer backside by residual chemical vapor have therefore been amply described in the above description and in the appended drawings of FIGS. 2, 3 and 4.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A method for chemical treating a wafer topside without damaging the wafer backside by residual chemical vapor in a process chamber comprising the steps of:

providing a wafer chuck for mounting a wafer thereon;

positioning the wafer chuck in said process chamber wherein an upper surface of the chuck substantially separates an upper chamber and a lower chamber;

rotating said chuck and conducting a chemical process on said topside of the wafer while simultaneously flowing an inert gas through a sidewall of said wafer chuck into an upper portion of said lower chamber, and stopping a flow of said chemical vapor into said upper chamber and withdrawing residual chemical vapor from said upper chamber while said inert gas being flown into said lower chamber for stopping chemical vapor flowing from said lower chamber into said upper chamber and preventing said backside of the wafer from being attacked by said chemical vapor.

2. A method for chemical treating a wafer topside without damaging the wafer backside by residual chemical vapor in a process chamber according to claim 1 further comprising the step of mounting a wafer chuck in a process chamber of spin etcher.

3. A method for chemical treating a wafer topside without damaging the wafer backside by residual chemical vapor in a process chamber according to claim 1 further comprising the step of providing said process chamber in a multi-level spin etcher.

4. A method for chemical treating a wafer topside without damaging the wafer backside by residual chemical vapor in a process chamber according to claim 1 further comprising the step of rotating said chuck to a rotational speed between about 500 RPM and about 1200 RPM.

5. A method for chemical treating a wafer topside without damaging the wafer backside by residual chemical vapor in a process chamber according to claim 1 further comprising the step of flowing an inert gas of $N_2$ into said upper portion of said lower chamber.

6. A method for chemical treating a wafer topside without damaging the wafer backside by residual chemical vapor in a process chamber according to claim 1 further comprising the step of mounting a wafer onto a plurality of mounting pins in said upper surface of the wafer chuck such that said wafer being suspended over and spaced-apart from said upper surface.

7. A method for chemical treating a wafer topside without damaging the wafer backside by residual chemical vapor in a process chamber according to claim 1 further comprising the step of purging an inert gas onto said wafer backside during said rotation of the chuck and said chemical process being conducted on said wafer topside.

8. A method for chemical treating a wafer topside without damaging the water backside by residual chemical vapor in a process chamber according to claim 3 further comprising the step of moving said chuck upwardly or downwardly to each of a plurality of sub-chambers in said multi-level spin etcher.

9. A method for chemical treating a wafer topside without damaging the wafer backside by residual chemical vapor in a process chamber according to claim 1 further comprising the step of providing inert gas nozzles through said sidewall of the wafer chuck.

* * * * *